(12) United States Patent
Kang et al.

(10) Patent No.: US 11,386,973 B2
(45) Date of Patent: Jul. 12, 2022

(54) METHOD AND APPARATUS FOR BUILT IN REDUNDANCY ANALYSIS WITH DYNAMIC FAULT RECONFIGURATION

(71) Applicant: INDUSTRY-ACADEMIC COOPERATION FOUNDATION, YONSEI UNIVERSITY, Seoul (KR)

(72) Inventors: Sungho Kang, Seoul (KR); Ha Young Lee, Seoul (KR)

(73) Assignee: INDUSTRY-ACADEMIC COOPERATION FOUNDATION, YONSEI UNIVERSITY, Seoul (KR)

(*) Notice: Subject to any disclaimer, the term of this patent is extended or adjusted under 35 U.S.C. 154(b) by 158 days.

(21) Appl. No.: 16/877,109

(22) Filed: May 18, 2020

(65) Prior Publication Data

US 2020/0395093 A1 Dec. 17, 2020

(30) Foreign Application Priority Data

Jun. 17, 2019 (KR) .................. 10-2019-0071455

(51) Int. Cl.
*G11C 29/00* (2006.01)
*G11C 29/44* (2006.01)
*G11C 29/18* (2006.01)

(52) U.S. Cl.
CPC .......... *G11C 29/4401* (2013.01); *G11C 29/18* (2013.01); *G11C 29/72* (2013.01); *G11C 29/76* (2013.01); *G11C 2029/4402* (2013.01)

(58) Field of Classification Search
CPC ..... G11C 29/4401; G11C 29/18; G11C 29/72; G11C 29/76; G11C 2029/4402
See application file for complete search history.

(56) References Cited

U.S. PATENT DOCUMENTS

| | | | |
|---|---|---|---|
| 2012/0260138 A1* | 10/2012 | Downing, III | G06F 11/0775 714/723 |
| 2016/0041878 A1* | 2/2016 | Davis | G11C 29/76 714/6.13 |
| 2016/0284426 A1* | 9/2016 | Busi | G01R 31/3187 |
| 2017/0262337 A1* | 9/2017 | Chang | G11C 29/42 |

FOREIGN PATENT DOCUMENTS

| | | |
|---|---|---|
| KR | 20020069731 A | 9/2002 |
| KR | 20120055213 A | 5/2012 |
| KR | 101211042 B1 | 12/2012 |

* cited by examiner

*Primary Examiner* — Christine T. Tu

(57) ABSTRACT

The present embodiments provides a memory repair solution finding device and method which find a fault by testing a memory and find a repair solution in parallel and dynamically reconfigure the stored fault information to minimize a repair solution searching time with an optimal repair rate.

17 Claims, 23 Drawing Sheets

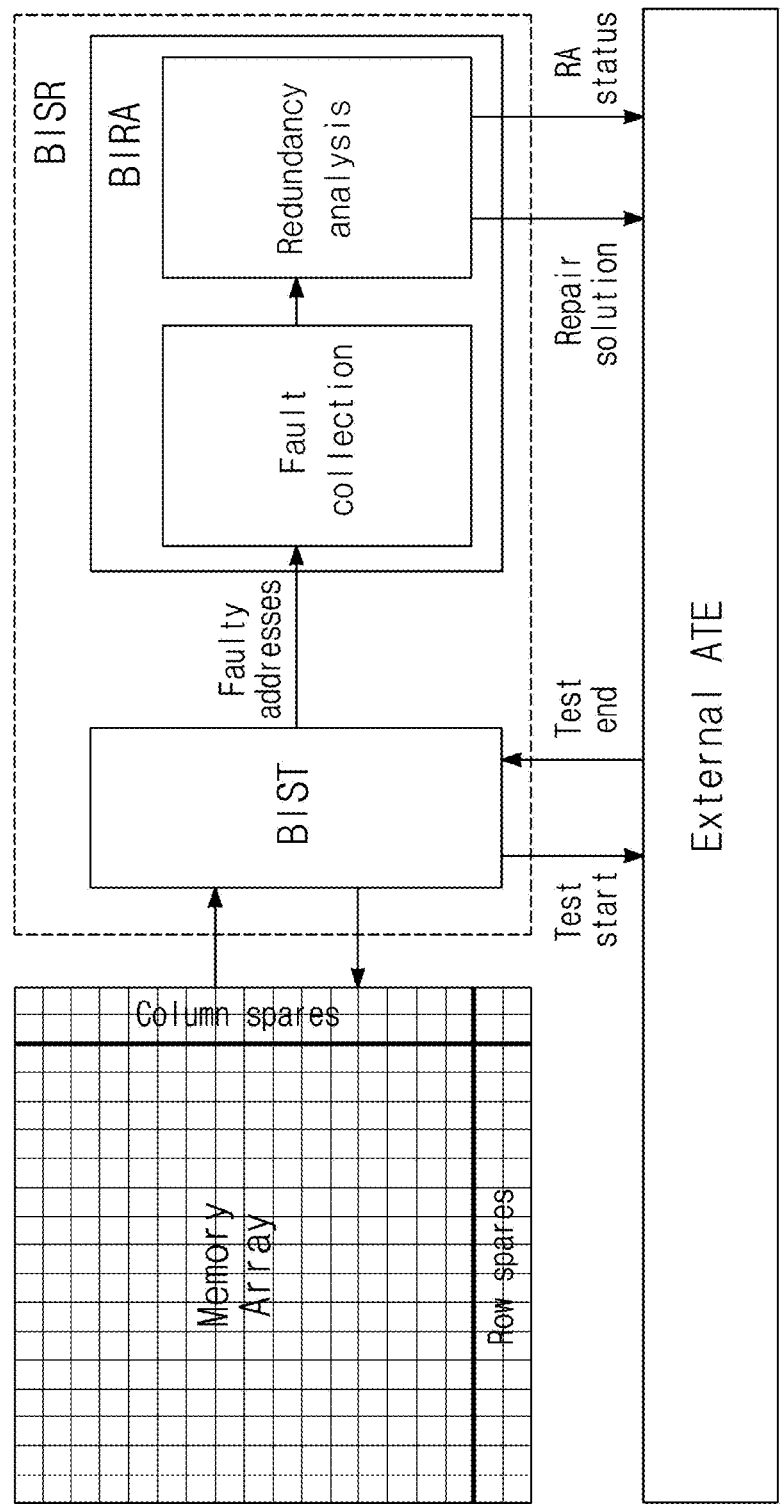
[FIG. 1]

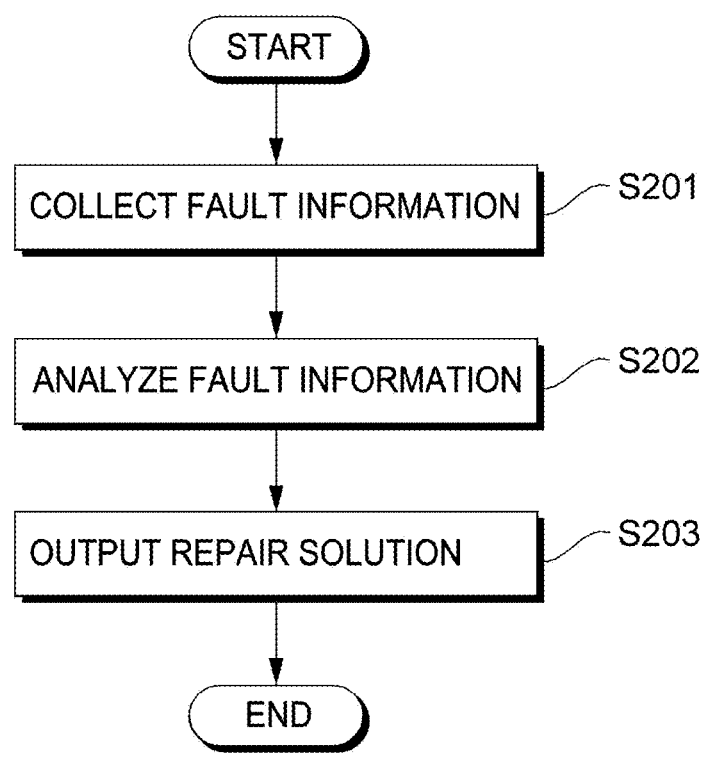
[FIG. 2A]

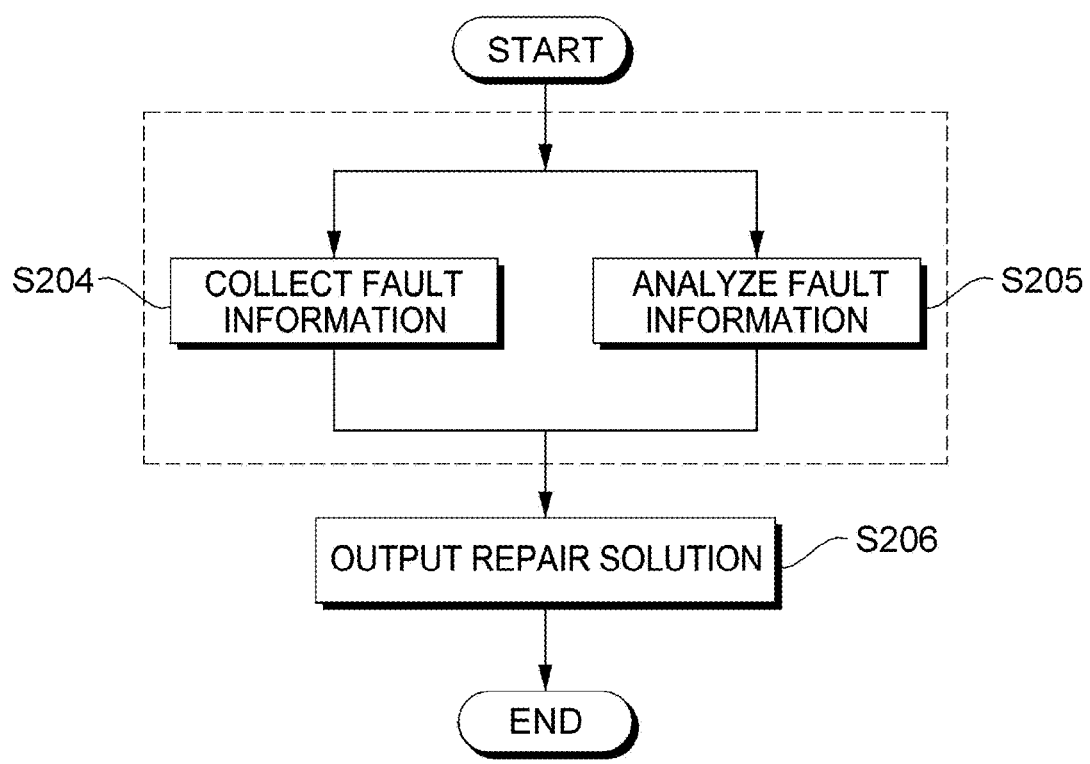
[FIG. 2B]

[FIG. 3]
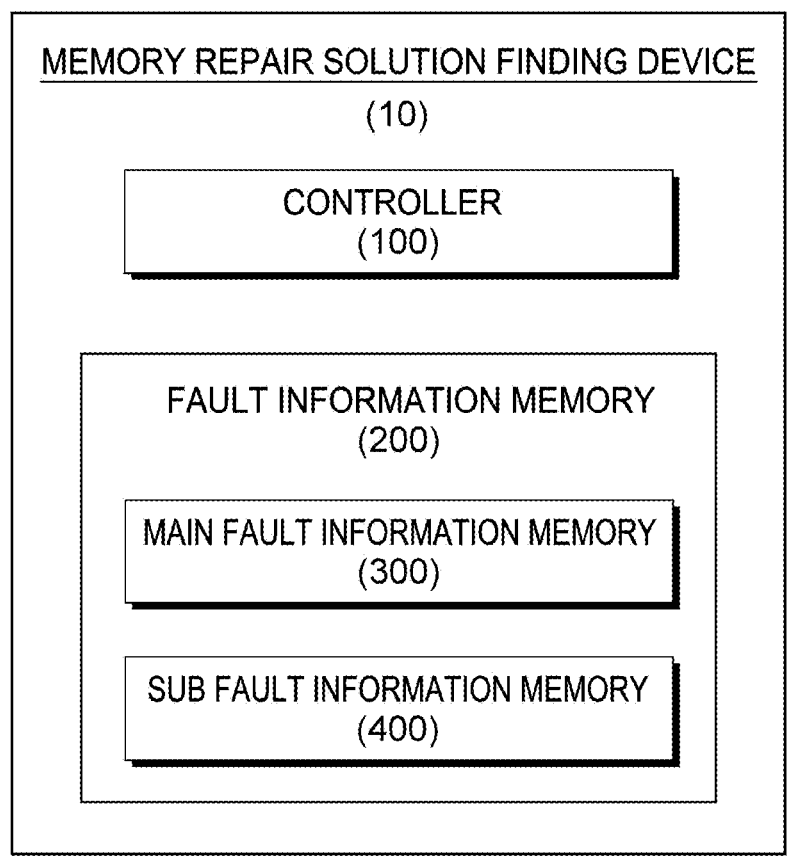

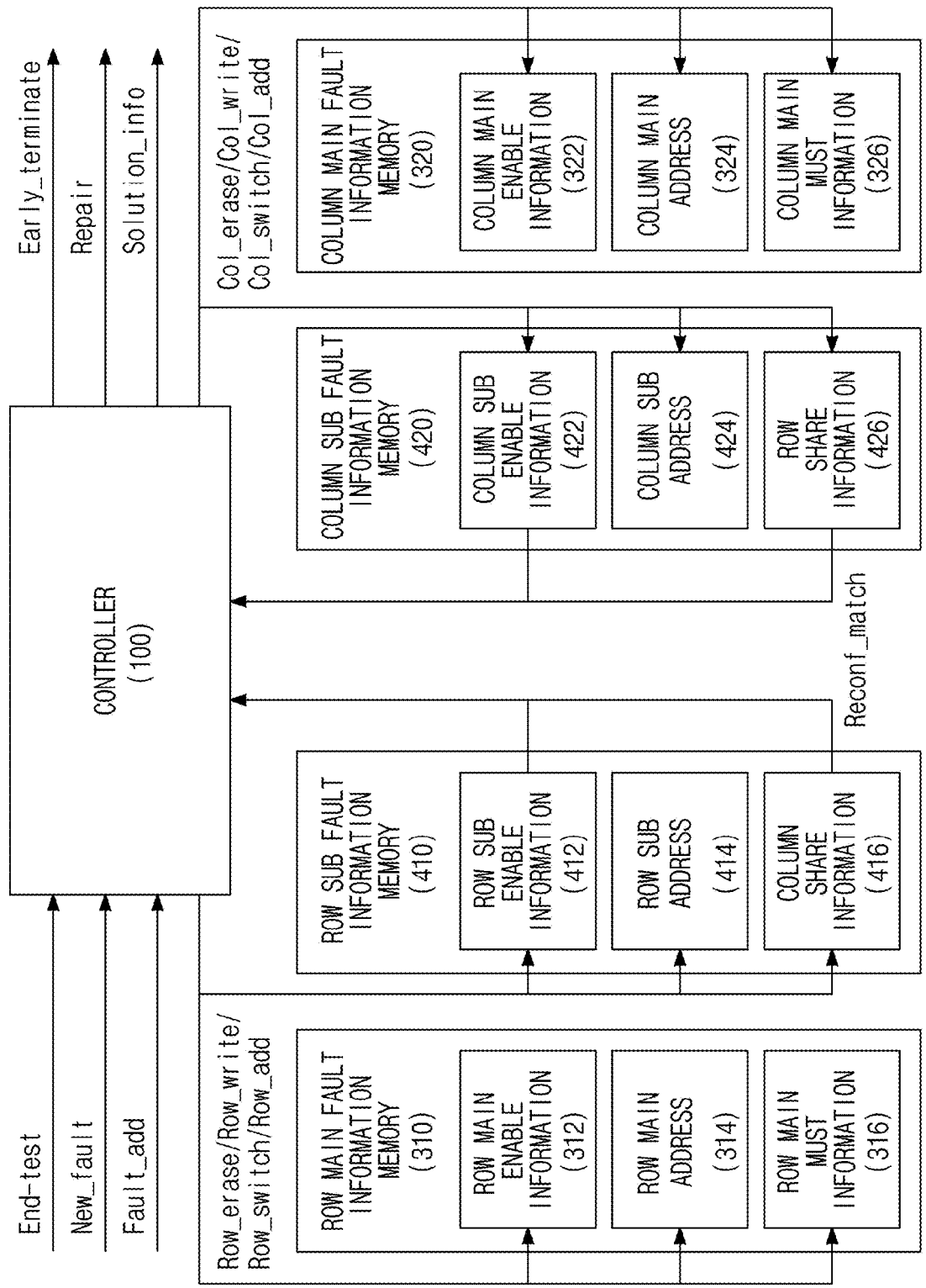
[FIG. 4]

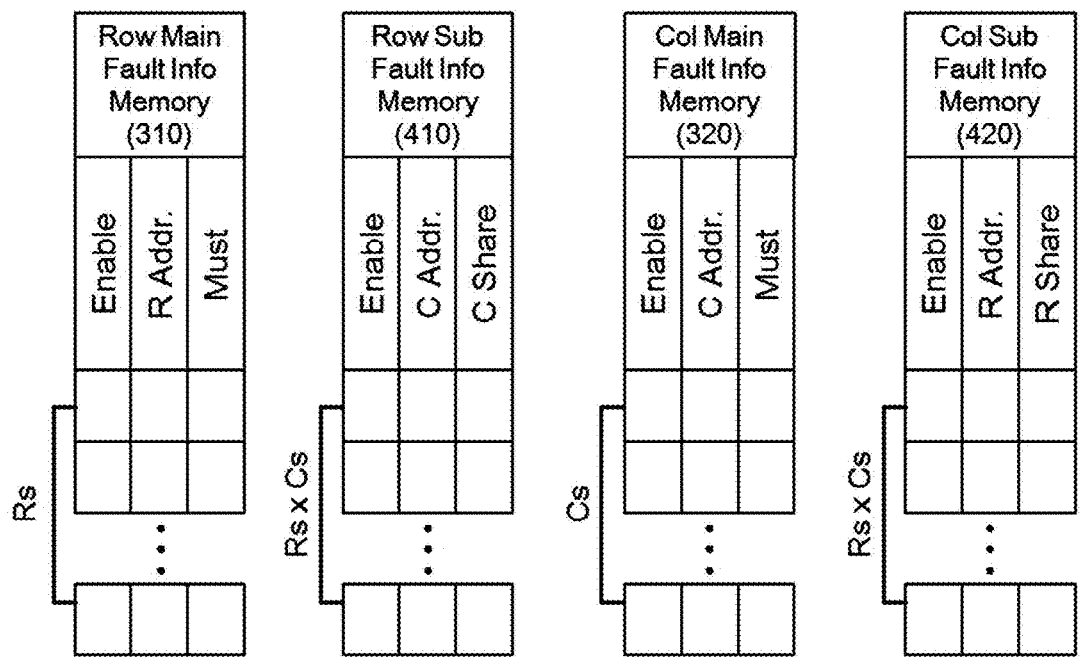
[FIG. 5]

[FIG. 6]
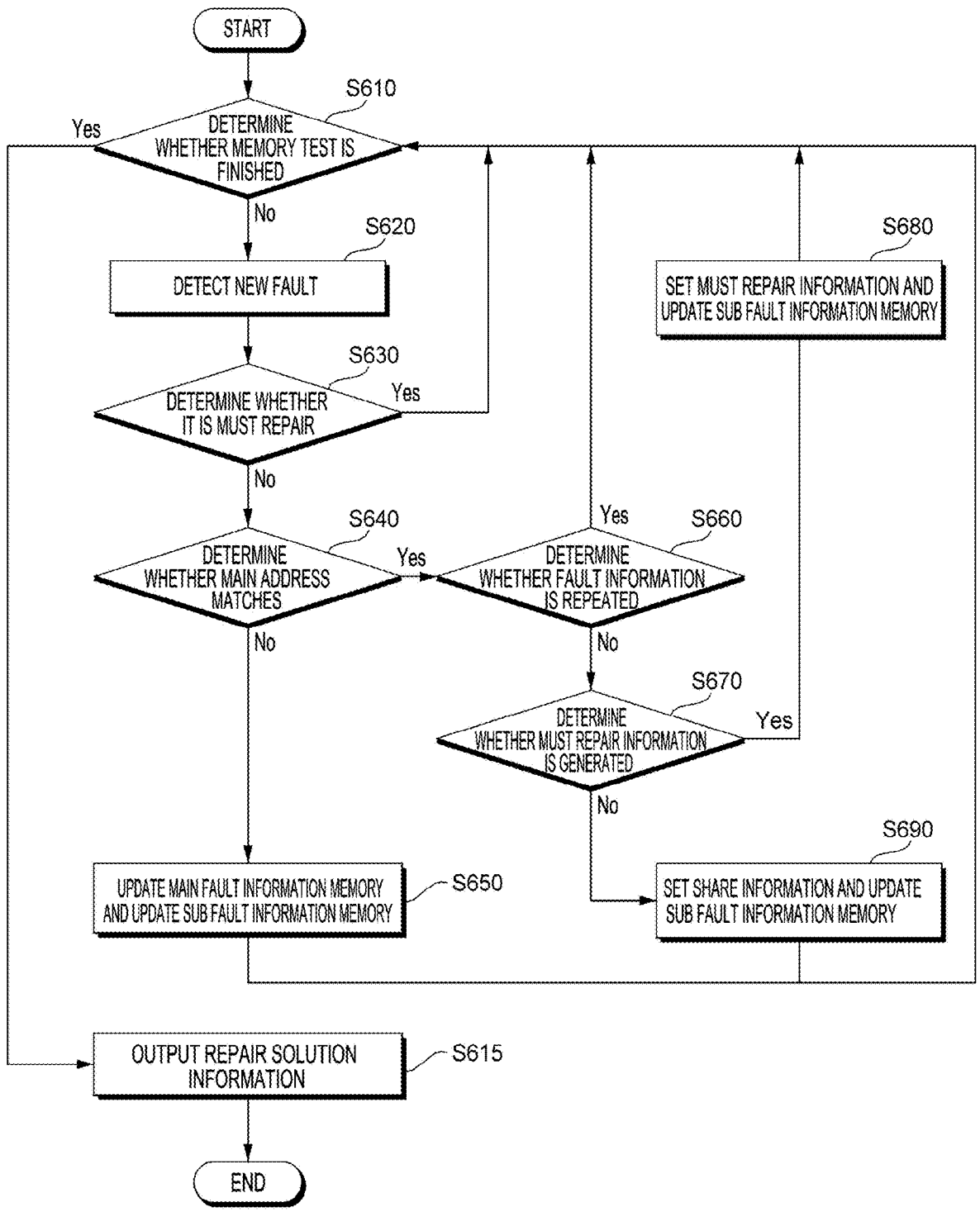

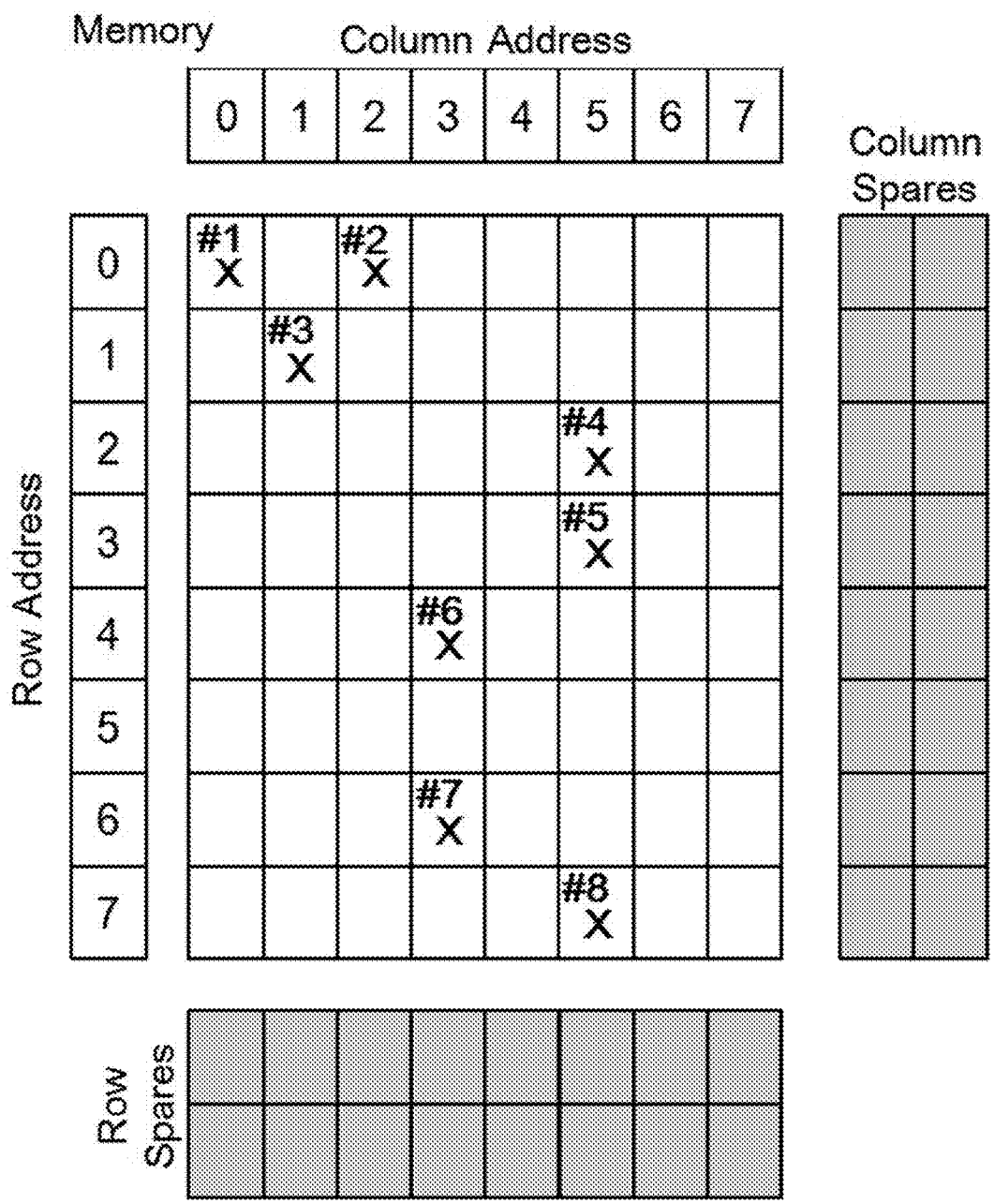
[FIG. 7A]

[FIG. 7B]
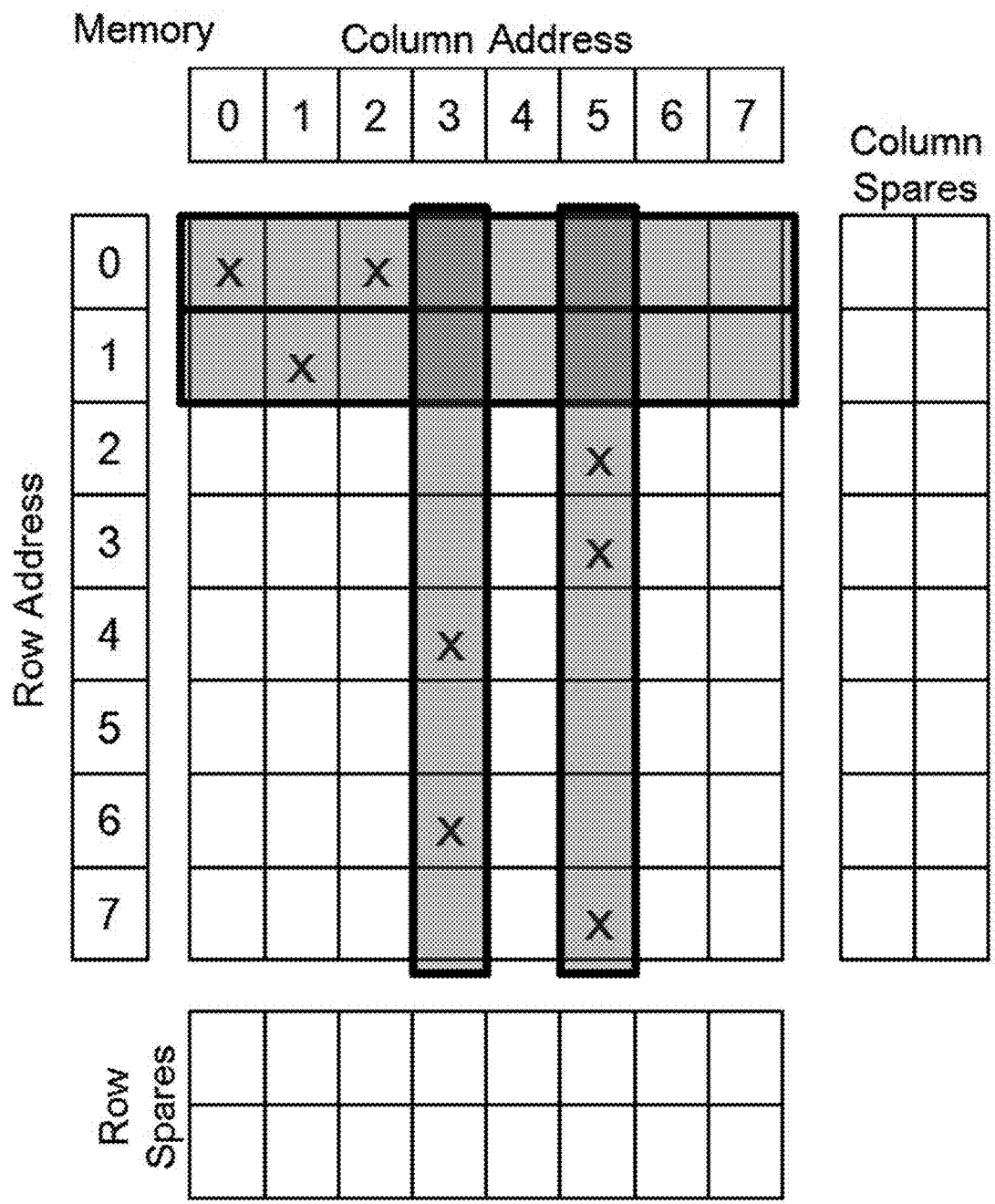

| Row Main Fault Info Memory | | |
|---|---|---|
| Enable | R Addr. | Must |
| 1 | 0 | 0 |
| | | |

| Row Sub Fault Info Memory | | |
|---|---|---|
| Enable | C Addr. | C Share |
| 1 | 0 | 0 |
| 1 | 2 | 0 |
| | | |
| | | |

| Col Main Fault Info Memory | | |
|---|---|---|
| Enable | C Addr. | Must |
| | | |
| | | |

| Col Sub Fault Info Memory | | |
|---|---|---|
| Enable | R Addr. | R Share |
| | | |
| | | |
| | | |

| Row Main Fault Info Memory | | |
|---|---|---|
| Enable | R Addr. | Must |
| 1 | 0 | 0 |
| 1 | 2 | 0 |

| Row Sub Fault Info Memory | | |
|---|---|---|
| Enable | C Addr. | C Share |
| 1 | 0 | 0 |
| 1 | 2 | 0 |
| 1 | 5 | 0 |

| Col Main Fault Info Memory | | |
|---|---|---|
| Enable | C Addr. | Must |
| 1 | 1 | 0 |
| | | |

| Col Sub Fault Info Memory | | |
|---|---|---|
| Enable | R Addr. | R Share |
| 1 | 1 | 0 |
| | | |

| Row Main Fault Info Memory | | |
|---|---|---|
| Enable | R Addr. | Must |
| 1 | 0 | 0 |
| 1 | 2 | 0 |

| Row Sub Fault Info Memory | | |
|---|---|---|
| Enable | C Addr. | C Share |
| 1 | 0 | 0 |
| 1 | 2 | 0 |
| 1 | 5 | 1 |

| Col Main Fault Info Memory | | |
|---|---|---|
| Enable | C Addr. | Must |
| 1 | 1 | 0 |
| 1 | 5 | 0 |

| Col Sub Fault Info Memory | | |
|---|---|---|
| Enable | R Addr. | R Share |
| 1 | 1 | 0 |
| 1 | 3 | 0 |

[FIG. 8D]

Fault reconfiguration 1

| Row Main Fault Info Memory | | | Row Sub Fault Info Memory | | | Col Main Fault Info Memory | | | Col Sub Fault Info Memory | | |
|---|---|---|---|---|---|---|---|---|---|---|---|
| Enable | R Addr. | Must | Enable | C Addr. | C Share | Enable | C Addr. | Must | Enable | R Addr. | R Share |
| 1 | 0 | 0 | 1 | 0 | 0 | 1 | 1 | 0 | 1 | 1 | 0 |
| ~~1~~ | ~~2~~ | ~~0~~ | 1 | 2 | 0 | 1 | 5 | 0 | 1 | 3 | 0 |
|  |  |  | ~~1~~ | ~~5~~ | ~~1~~ |  |  |  | 1 | 2 | 0 |

| Row Main Fault Info Memory | | |
|---|---|---|
| Enable | R Addr. | Must |
| 1 | 0 | 0 |
| 1 | 4 | 0 |

| Row Sub Fault Info Memory | | |
|---|---|---|
| Enable | C Addr. | C Share |
| 1 | 0 | 0 |
| 1 | 2 | 0 |
| 1 | 3 | 0 |
| | | |

| Col Main Fault Info Memory | | |
|---|---|---|
| Enable | C Addr. | Must |
| 1 | 1 | 0 |
| 1 | 5 | 0 |

| Col Sub Fault Info Memory | | |
|---|---|---|
| Enable | R Addr. | R Share |
| 1 | 1 | 0 |
| 1 | 3 | 0 |
| 1 | 2 | 0 |

| Row Main Fault Info Memory | | | Row Sub Fault Info Memory | | | Col Main Fault Info Memory | | | Col Sub Fault Info Memory | | |
|---|---|---|---|---|---|---|---|---|---|---|---|
| Enable | R Addr. | Must | Enable | C Addr. | C Share | Enable | C Addr. | Must | Enable | R Addr. | R Share |
| 1 | 0 | 0 | 1 | 0 | 0 | 1 | 1 | 0 | 1 | 1 | 0 |
| 1 | 4 | 0 | 1 | 2 | 0 | 1 | 5 | 0 | | | |
| | | | 1 | 3 | 1 | | | | 1 | 3 | 0 |
| | | | | | | | | | 1 | 2 | 0 |

Buffer (6,3)

[FIG. 8G]
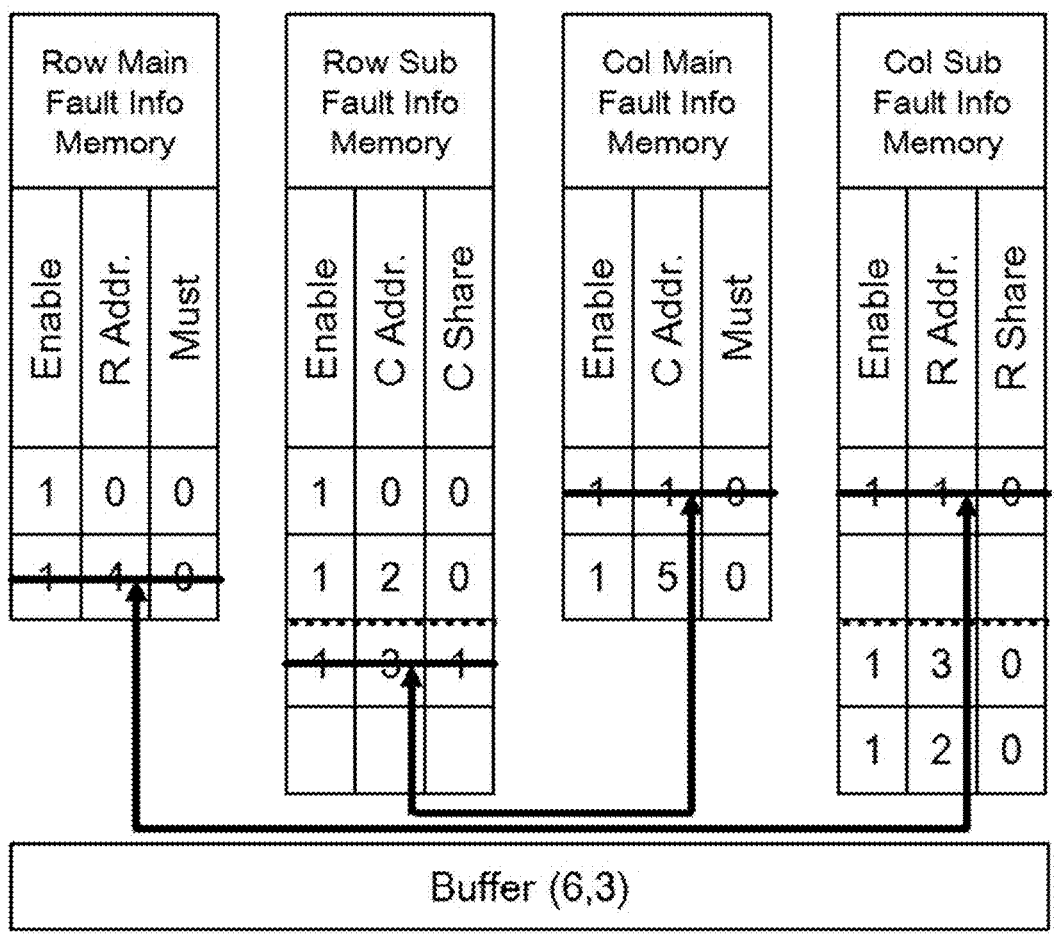

[FIG. 8H]

| Row Main Fault Info Memory | | | Row Sub Fault Info Memory | | | Col Main Fault Info Memory | | | Col Sub Fault Info Memory | | |
|---|---|---|---|---|---|---|---|---|---|---|---|
| Enable | R Addr. | Must | Enable | C Addr. | C Share | Enable | C Addr. | Must | Enable | R Addr. | R Share |
| 1 | 0 | 0 | 1 | 0 | 0 | 1 | 3 | 0 | 1 | 4 | 0 |
| 1 | 1 | 0 | 1 | 2 | 0 | 1 | 5 | 0 | 1 | 6 | 0 |
| | | | 1 | 1 | 0 | | | | 1 | 3 | 0 |
| | | | | | | | | | 1 | 2 | 0 |

Buffer

| Row Main Fault Info Memory | | |
|---|---|---|
| Enable | R Addr. | Must |
| 1 | 0 | 0 |
| 1 | 1 | 0 |

| Row Sub Fault Info Memory | | |
|---|---|---|
| Enable | C Addr. | C Share |
| 1 | 0 | 0 |
| 1 | 2 | 0 |
| 1 | 1 | 0 |
| | | |

| Col Main Fault Info Memory | | |
|---|---|---|
| Enable | C Addr. | Must |
| 1 | 3 | 0 |
| 1 | 5 | 1 |

| Col Sub Fault Info Memory | | |
|---|---|---|
| Enable | R Addr. | R Share |
| 1 | 4 | 0 |
| 1 | 6 | 0 |
| 1 | 3 | 0 |
| 1 | 2 | 0 |

| Row Main Fault Info Memory | | |
|---|---|---|
| Enable | R Addr. | Must |
| 1 | 0 | 0 |
| 1 | 1 | 0 |

| Row Sub Fault Info Memory | | |
|---|---|---|
| Enable | C Addr. | C Share |
| 1 | 0 | 0 |
| 1 | 2 | 0 |
| 1 | 1 | 0 |

| Col Main Fault Info Memory | | |
|---|---|---|
| Enable | C Addr. | Must |
| 1 | 3 | 0 |
| 1 | 5 | 1 |

| Col Sub Fault Info Memory | | |
|---|---|---|
| Enable | R Addr. | R Share |
| 1 | 4 | 0 |
| 1 | 6 | 0 |
| 1 | 3 | 0 |
| 1 | 2 | 0 |

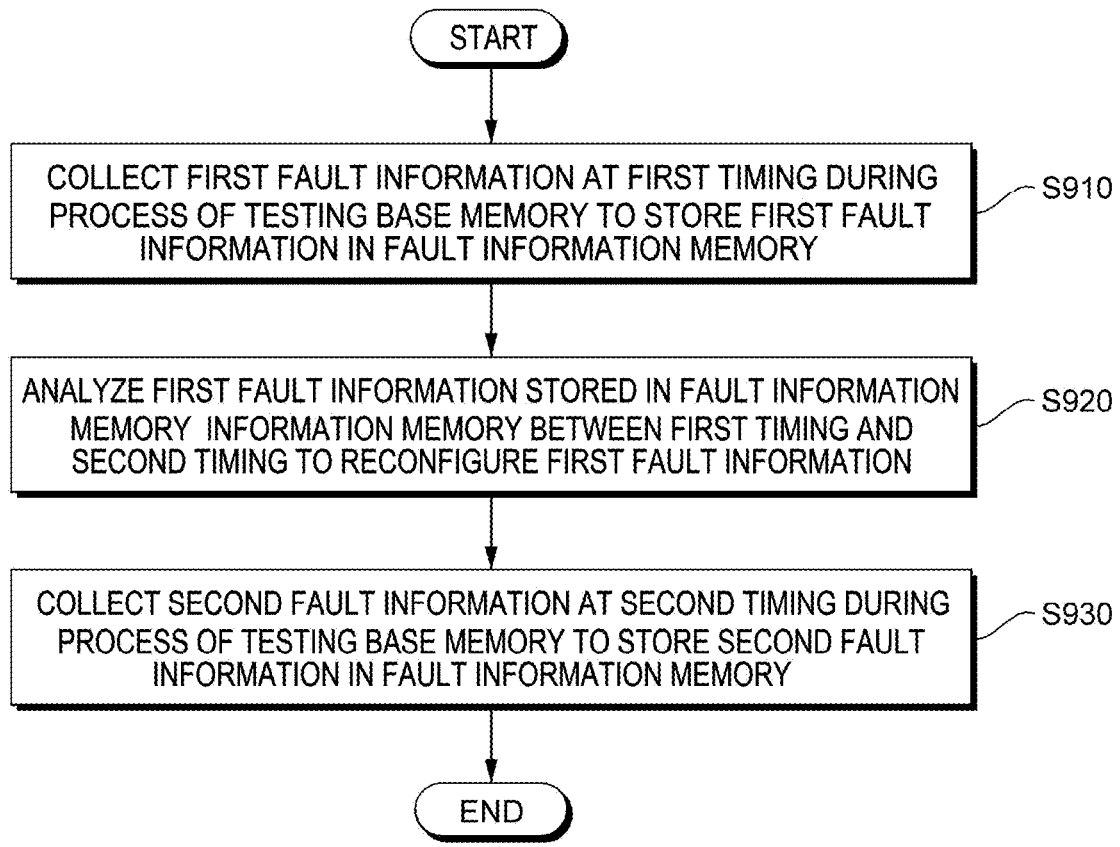
[FIG. 9]

[FIG. 10A]

Repair rate comparison for various BIRAs (Rs=4, Cs=4)

| BIRA | Number of faults | | | | | |
|---|---|---|---|---|---|---|
| | 8 | 9 | 10 | 11 | 12 | 13 |
| ESP | 1.000 | 0.881 | 0.678 | 0.428 | 0.214 | 0.089 |
| LRM(max) | 1.000 | 0.899 | 0.694 | 0.443 | 0.239 | 0.107 |
| CRESTA | 1.000 | 0.913 | 0.719 | 0.475 | 0.273 | 0.142 |
| ISF | 1.000 | 0.913 | 0.719 | 0.475 | 0.273 | 0.142 |
| SFCC | 1.000 | 0.913 | 0.719 | 0.475 | 0.273 | 0.142 |
| BRANCH | 1.000 | 0.913 | 0.719 | 0.475 | 0.273 | 0.142 |
| AMT | 1.000 | 0.913 | 0.719 | 0.475 | 0.273 | 0.142 |
| Bitmap | 1.000 | 0.911 | 0.711 | 0.464 | 0.258 | 0.126 |
| FFR | 1.000 | 0.913 | 0.719 | 0.475 | 0.273 | 0.142 |
| Proposed | 1.000 | 0.913 | 0.719 | 0.475 | 0.273 | 0.142 |

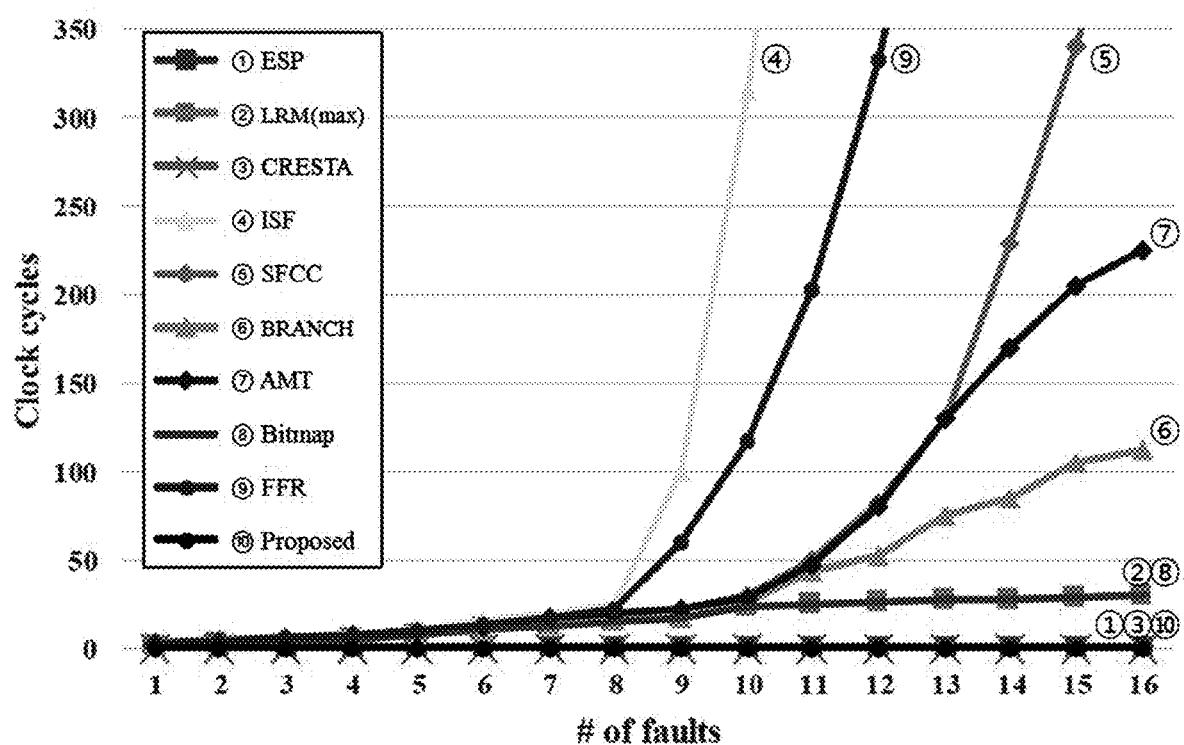
[FIG. 10B]

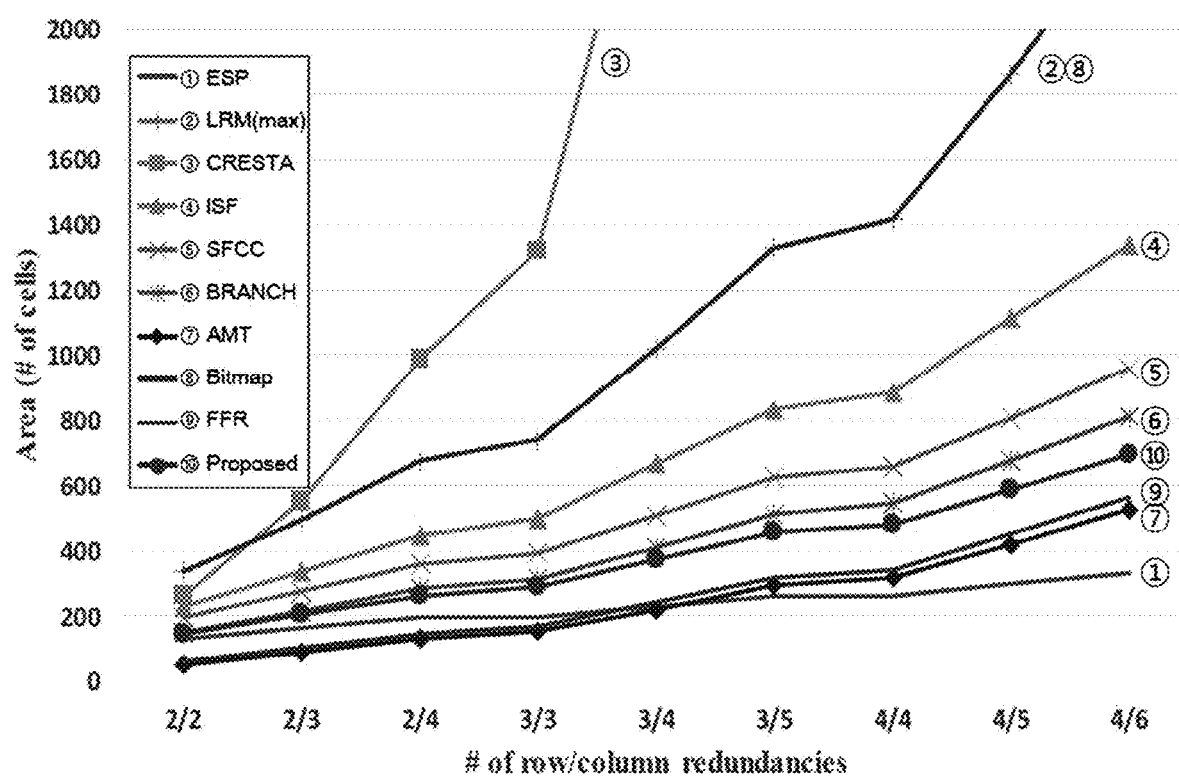
[FIG. 10C]

METHOD AND APPARATUS FOR BUILT IN REDUNDANCY ANALYSIS WITH DYNAMIC FAULT RECONFIGURATION

CROSS-REFERENCE TO RELATED APPLICATIONS

This application claims priority to and the benefit of Korean Patent Application No. 10-2019-0071455 filed in the Korean Intellectual Property Office on Jun. 17, 2019, the entire contents of which are incorporated herein by reference.

TECHNICAL FIELD

A technical field of the present disclosure relates to a built in redundancy analysis (BIRA) circuit which tests and analyzes faults of a memory. This study is related to a semiconductor design technology for improving the robustness of in-memory computing of a mid-size research project supported by the Ministry of Science and ICT (No. 2019R1A2C3011079).

BACKGROUND ART

The contents described in this section merely provide background information on the present exemplary embodiment but do not constitute the related art.

Whenever faults are found by the memory test, memory-embedded repair hardware of the related art quickly stores the faults in a separate fault information memory such as a content addressable memory (CAM) and when all the test of the memory is finished, analyzes all faults stored in the fault information memory at one time to derive a final repair solution.

A fault information memory based memory-embedded repair hardware analyzes a plurality of fault information at one time after finishing the memory test so that an optimal repair rate may be ensured. However, when the repair solution is derived by analyzing the fault information at one time after finishing the memory test, a repair time is additionally required. The repair time is directly related to the cost and the increase of the overall test and repair time increases the cost for repairing the memory.

(Patent Document 1) Korean Registered Patent Publication No. 10-1211042 (Dec. 13, 2012)

SUMMARY OF THE INVENTION

A main object of exemplary embodiments of the present disclosure is to simultaneously find a repair solution while finding faults by the memory test and dynamically reconfigure stored fault information to minimize a repair solution searching time with an optimal repair rate.

Other and further objects of the present disclosure which are not specifically described can be further considered within the scope easily deduced from the following detailed description and the effect.

According to an aspect of the present embodiment, a memory repair solution finding device includes: a fault information memory which stores fault information of a base memory; and a controller which is connected to the fault information memory and transmits a command for reconfiguring a location where the fault information of the base memory is stored to the fault information memory.

In an entire time when the controller collects the fault information of the base memory, at a time when new fault information is not received, the fault information memory may reconfigure the location of the stored fault information.

The fault information memory may include (i) a main fault information memory which stores a part of an address of fault information of the base memory and (ii) a sub fault information memory which stores the other part of the address of the fault information of the base memory.

When parts of two addresses for the fault information of the base memory are the same, the main fault information memory may store one address information which is the same and the sub fault information memory stores two different address information.

A size of a main fault information memory may be allocated based on a number of spare resources which replace some lines of the base memory.

A size of the sub fault information memory may be allocated based on the number of spare resources in accordance with a direction of a line corresponding to the spare resource in consideration of the must repair condition of the base memory.

The main fault information memory may have (i) some of address information for fault information of the base memory and (ii) must repair information indicating a line to be necessarily repaired in a spare resource which replaces the fault of the base memory in the unit of lines.

The sub fault information memory may have (i) the other part of address information for fault information of the base memory and (ii) share information indicating that as some of addresses for fault information overlap, it is replaceable with a line having a different direction in the spare resource.

The main fault information memory may include (i) a row main fault information memory and (ii) a column main fault information memory which are classified based on the spare resource which replaces the fault of the base memory in the unit of lines.

The sub fault information memory may include (i) a row sub fault information memory which stores the other part of address information which is combined with some of address information stored in the row main fault information memory to generate the entire address of the fault information and (ii) a column sub fault information memory which stores the other part of address information which is combined with some of address information stored in the column main fault information memory to generate the entire address of the fault information.

The row sub fault information memory may include column share information indicating that it corresponds to some of address information stored in the column main fault information memory or corresponds to a column address of new fault information.

The column sub fault information memory may include row share information indicating that it corresponds to some of address information stored in the row main fault information memory or corresponds to a row address of new fault information.

After receiving new fault information, when some of the address of the new fault information matches an address stored in the main fault information memory, the controller may store the other part of the address of the new fault information in the sub fault information memory.

After receiving new fault information, when some of the address of the new fault information do not match an address stored in the main fault information memory, the controller may store some of the address of the new fault information in the main fault information memory and the other part of the address in the sub fault information memory.

After the fault information memory stores the new fault information, when there is share information in the sub fault information memory, in the overall time when fault information of the base memory is collected, at a time when the new fault information is not received, the main fault information memory and the sub fault information memory may reconfigure the stored address to prepare a storable address.

After the controller receives the new fault information, when the remaining space is not sufficient in the main fault information memory, the controller or a separate buffer temporarily stores the address of the new fault information and the main fault information memory and the sub fault information memory may reconfigure the stored address to prepare a storable address.

When the remaining space is not sufficient in the main fault information memory, a plurality of corresponding addresses may be switched such that the address having share information in the sub fault information memory does not have the share information.

When the new fault information which is received by the controller does not correspond to the must repair information and the space remaining in the main fault information memory is not sufficient so that even though the main fault information memory and the sub fault information memory reconfigure the stored address, new fault information cannot be stored, the controller outputs an early termination signal.

When the test of the base memory is finished so that new fault information cannot be received, the controller outputs the address stored in the main fault information memory as a repair solution.

According to another aspect of the present embodiment, a memory repair solution finding method includes: collecting fault information of a base memory to store the fault information in a fault information memory; and analyzing the fault information using the fault information memory to derive a repair solution, in parallel.

In the storing of fault information, after collecting first fault information at a first timing by testing the base memory, the first fault information may be stored in the fault information memory and after collecting second fault information at a second timing by testing the base memory, the second fault information may be stored in the fault information memory, In the deriving of a repair solution, a location of an address for the first fault information stored in the fault information memory may be reconfigured between the first timing and a second timing before storing second fault information.

In the storing of the fault information, the fault information memory may be dynamically analyzed to determine a location in which an address for the fault information is stored.

In the deriving of a repair solution, when the test of the base memory is finished, a part of the address stored in the fault information memory may be output as a repair solution.

The fault information memory may include (i) a main fault information memory which stores a part of an address of fault information of the base memory and (ii) a sub fault information memory which stores the other part of the address of the fault information of the base memory.

In the storing of fault information, a location in which a part of the address for the fault information is stored may be determined in consideration of distribution of a remaining space in the main fault information memory.

In the deriving of the repair solution, when in a spare resource which replaces the fault of the base memory in the unit of lines, the number of faults in one line is larger than the number of lines having a different direction, must repair information may be written in the main fault information memory.

In the deriving of the repair solution, since a part of the address for the fault information of the base memory overlaps, if the fault of the base memory can be replaced with a line having a different direction in the spare resource, share information may be written in the sub fault information memory.

As described above, according to the exemplary embodiments of the present disclosure, it is possible to simultaneously find a repair solution while finding fault by the memory test and dynamically reconfigure stored fault information to minimize a repair solution searching time.

Even if the effects are not explicitly mentioned here, the effects described in the following specification which are expected by the technical features of the present disclosure and their potential effects are handled as described in the specification of the present disclosure.

BRIEF DESCRIPTION OF THE DRAWINGS

FIG. 1 is a block diagram illustrating a BISR;

FIG. 2A is a flowchart illustrating an operation of a BIRA of the related art;

FIG. 2B is a flowchart illustrating an operation of a BIRA according to exemplary embodiments of the present disclosure;

FIG. 3 is a block diagram illustrating a memory repair solution finding device according to an exemplary embodiment of the present disclosure;

FIG. 4 is a view illustrating a signal flow of a memory repair solution finding device according to an exemplary embodiment of the present disclosure;

FIG. 5 is a view illustrating a fault information memory of a memory repair solution finding device according to an exemplary embodiment of the present disclosure;

FIG. 6 is a flowchart illustrating an operation of storing fault information by a memory repair solution finding device according to an exemplary embodiment of the present disclosure;

FIG. 7A is a view illustrating a base memory which is tested by a memory repair solution finding device according to an exemplary embodiment of the present disclosure;

FIG. 7B is a view illustrating a repair solution found by a memory repair solution finding device according to an exemplary embodiment of the present disclosure;

FIGS. 8A to 8J are views illustrating an operation of dynamically determining and storing a location of fault information in a fault information memory of a memory repair solution finding device according to an exemplary embodiment of the present disclosure;

FIG. 9 is a flowchart illustrating a memory repair solution finding method according to another exemplary embodiment of the present disclosure;

FIG. 10A is a view illustrating a repair rate according to various types of BIRA;

FIG. 10B is a graph illustrating an analysis time according to various types of BIRA; and FIG. 10C is a graph illustrating a hardware overhead according to various types of BIRA.

DETAILED DESCRIPTION OF THE EMBODIMENT

Hereinafter, in the description of the present disclosure, a detailed description of the related known functions will be omitted if it is determined that the gist of the present disclosure may be unnecessarily blurred as it is obvious to those skilled in the art and some exemplary embodiments of the present disclosure will be described in detail with reference to exemplary drawings.

FIG. 1 illustrates a built-in self-repair (BISR) method using a spare resources. A built-in self-test module automatically generates a pattern for testing a test target circuit to automatically input the pattern to the test target circuit and then compares a result value after testing with the test pattern with a result value desired by a user to determine whether the circuit is faulty. A built-in redundancy analysis module finds a faulty part of the memory by the BIST module and then determines how to reconfigure the faulty part in a redundant memory using the fault information. When a user reads out or writes data with a faulty address, the BISR uses the reconfigured information to replace the faulty memory with a redundant memory so that the user may use the memory as if a memory which is not faulty is used.

The memory may be implemented as a single layer memory or a stacked memory device. The stacked memory device refers to a three-dimensional computer memory including one or more combined memory die layers, memory packages, and other memory elements. The stacked memory device includes a plurality of memory layers and system layers and is implemented on a substrate.

The stacked memory device may be vertically stacked or horizontally stacked (for example, side-by-side) or may include memory elements which are coupled to each other. The plurality of memory layers may be implemented by a dynamic random access memory (DRAM), but is not limited thereto. In accordance with the advent of a stacked DRAM standard (Wide IO), a DRAM wafer may be laminated on the same package having a memory stack together with a system element such as a system on chip (SoC) wafer. In the stacked memory device, the memory layers for every device may vary depending on manufactures of the DRAM.

The plurality of memory layers may be connected to each other through a through silicon via. The stacked memory uses through silicon via (TSV) manufacturing techniques and vias are produced through silicon dies to provide signal passages through the memory stack. When the connection is performed by the through silicon via, an uppermost (or outermost) memory die layer may be excluded.

The system layer may include elements such as a central processing unit (CPU), a memory controller, and other related system elements. The system layer may include a system on chip (SoC). The logic chip may be an application processor or a graphics processing unit (GPU).

The memory repair is comprehensive and may be applied to an arbitrary memory format which is performed by a memory manufacturing company. In some embodiments, the memory device stores data in a separate memory such as CAM or converts addresses of defective parts of the memory with perfect parts of the memory to provide redundancy for the defective elements. In some embodiments, spare rows, columns, or blocks of the defective memory of the memory may be implemented in predetermined existing DRAMs.

The redundant memory replaces a faulty cell in the base memory. The redundant memory may replace one or more faulty cells in a cell unit or a line unit. The redundant memory may repair by replacing a line connected to a row or a column of the plurality of memory layers. The redundant memory may repair by replacing a line connected to a row or a column of a base memory. The redundant memory may use physical replacement or perform logic replacement which operates like a matrix corresponding to a memory layer.

FIG. 2A is a flowchart illustrating an operation of a BIRA of the related art and FIG. 2B is a flowchart illustrating an operation of a BIRA according to exemplary embodiments of the present disclosure.

Referring to FIG. 2A, the existing memory repair method collects fault information during the process of testing a memory in step S201. After collecting the fault information, fault information is additionally analyzed in step S202. After analyzing the fault information, a repair solution is output in step S203. In order to achieve an optimal repair rate, memory-embedded repair hardware of the related art analyzes the faults at one time after finishing the memory test to derive the repair solution so that a repair time is long.

Referring to FIG. 2A, the BIRA according to the exemplary embodiments of the present disclosure is designed to reconfigure the fault using a spare time when a memory fault is not found while testing the memory so that the memory-embedded repair hardware does nothing but only waits for a new fault to derive the repair solution as soon as the memory test finishes.

Unlike the memory-embedded repair hardware of the related art, the memory repair solution finding method according to the present exemplary embodiment collects faults found by the memory test (S204) and analyzes the fault for finding the repair solution (S205) in parallel, and finally derives the memory repair solution (S206). During the memory test process, the fault information is collected and analyzed in parallel so that additional time and cost are not generated.

FIG. 3 is a block diagram illustrating a memory repair solution finding device according to an exemplary embodiment of the present disclosure. FIG. 4 is a view illustrating a signal flow of a memory repair solution finding device according to an exemplary embodiment of the present disclosure.

The memory repair solution finding device 10 includes a controller 100 and a fault information memory 200.

The controller 100 is implemented by a processor and is connected to the fault information memory 200. The controller 100 may transmit a command for reconfiguring a location in which fault information of the basic information is stored to the fault information memory.

The fault information memory 200 stores fault information of the base memory. In an entire time when the controller 100 collects the fault information of the base memory, at a time when new fault information is not received, the fault information memory 200 reconfigures the location of the stored fault information.

The fault information memory 200 includes (i) a main fault information memory 300 which stores a part of an address of fault information of the base memory and (ii) a sub fault information memory 400 which stores the other part of the address of the fault information of the base memory.

When newly found fault information is input to the controller 100, the fault information is sent to store the fault information in an empty space of the fault information memory 200 together with a storage signal.

The controller 100 regularly receives a clock signal from the fault information memory 200. The controller 100 determines whether to reconfigure the fault while receiving a clock signal from which a new fault is not found and transmits a command for reconfiguring the fault to the fault information memory 200 to reconfigure the fault information. When the controller 100 determines whether to reconfigure the fault information, the controller 100 checks whether an additional space can be ensured in the fault information memory 200 by reconfiguring the fault. The controller 100 compares some data read from the fault information memory 200 to check whether to ensure the additional space.

The controller 100 may receive a test termination signal, whether to be a new fault, or fault information address from the memory test device. The controller 100 may output an early termination signal, whether to be repairable, repair solution data. The controller 100 transmits a command regarding data erase, data write, or data switch to the fault information memory 200 and transmits a part or all of the address. The controller 100 may receive a clock signal or a reconfiguration matching signal from the fault information memory 200.

When a new fault is found by the memory test, the controller 100 stores the fault information in an empty space of the fault information memory 200. When new fault information does not enter, the controller 100 compares the stored fault information to reconfigure the fault. The controller 100 simply compares sub enable information and share information to determine whether to reconfigure the fault. When the controller 100 determines to reconfigure the fault information, the controller 100 transmits a command for removing and creating necessary fault data to the fault information memory to complete the reconfiguration of the fault information.

The fault information memory 200 may include a row main fault information memory 310, a row sub fault information memory 410, a column main fault information memory 320, and a column sub fault information memory 420. The row main fault information memory 310 may store row main enable information 312, a row main address 314, and row main must information 316. The row main enable information 312, the row main address 314, and the row main must information 316 may be stored by one or more memories such as CAM.

The row sub fault information memory 410 may store row sub enable information 412, a row sub address 414, and column share information 416. The row sub enable information 412, the row sub address 414, and the column share information 416 may be stored by one or more memories such as CAM.

The column main fault information memory 320 may store column main enable information 322, a column main address 324, and column main must information 326. The column main enable information 322, the column main address 324, and the column main must information 326 may be stored by one or more memories such as CAM.

The column sub fault information memory 420 may store column sub enable information 422, a column sub address 424, and row share information 426. The column sub enable information 422, the column sub address 424, and the row share information 426 may be stored by one or more memories such as CAM.

FIG. 5 is a view illustrating a fault information memory of a memory repair solution finding device according to an exemplary embodiment of the present disclosure.

The fault of the memory may be mainly classified into a signal fault, sparse fault, and must repair fault.

The single fault is a state in which in a row address and a column address where a faulty cell is located, there is no other faulty cell.

The sparse fault is also referred to as a line fault and is a state in which there is a plurality of faults in a specific row address or a plurality of faults in a specific column address. A row line fault may be repaired by replacing the fault with one spare row or a plurality of spare columns. A row line fault may be repaired by replacing the fault with one spare row or a plurality of spare columns. A column line fault may be repaired by replacing the fault with one spare column or a plurality of spare rows.

The must repair fault is a state in which in a specific row address, the number of faults is larger than the number of spare columns Rc or in a specific column address, the number of faults is larger than the number of spare rows Rs. The must repair faulty state refers to a must repair condition. The row must repair fault needs to be repaired with a spare row and the column must repair fault needs to be repaired with a spare column.

A size of a main fault information memory is allocated based on a number of spare resources which replace some lines of the base memory. For example, the row main fault information memory 310 is allocated as many as the number of Rs and the column main fault information memory 320 is allocated as many as the number of Cs.

A size of the sub fault information memory is allocated based on the number of spare resources in accordance with a direction of a line corresponding to the spare resource in consideration of the must repair condition of the base memory. For example, the row sub fault information memory 410 is allocated as many as the number of Rs×Cs and the column sub fault information memory 420 is allocated as many as the number of Rs×Cs.

When parts of two addresses for the fault information of the base memory are the same, the main fault information memory stores one address information which is the same and the sub fault information memory stores two different address information. That is, the fault address is divided for the row and the column to be distributed to be stored in the main fault information memory and the sub fault information memory.

The main fault information memory has (i) some address information for fault information of the base memory and (ii) must repair information indicating a line to be necessarily repaired in a spare resource which replaces the fault of the base memory in the unit of lines. The main fault information memory may include enable information. The enable information indicates availability of stored fault information. The address information indicates a location of the fault in the base memory. The must repair information indicates must-repaired fault.

The sub fault information memory has (i) the other part of address information for fault information of the base memory and (ii) share information indicating that as some of addresses for fault information overlap, it is replaceable with a line having a different direction in the spare resource. The sub fault information memory may include enable information. The enable information indicates availability of stored fault information. The address information indicates a location of the fault in the base memory. Sparse fault is checked using share information and the share information provides a clue for reconfiguring the location. The enable information and the share information are compared to determine whether to reconfigure the location.

The main fault information memory includes (i) a row main fault information memory and (ii) a column main fault information memory which are classified based on the spare resource which replaces the fault of the base memory in the unit of lines. That is, the main fault information memory has a main fault information memory pair divided by a row and a column.

The sub fault information memory may include (i) a row sub fault information memory which stores the other part of address information which is combined with some of address information stored in the row main fault information memory to generate the entire address of the fault information and (ii) a column sub fault information memory which stores the other part of address information which is combined with some of address information stored in the column main fault information memory to generate the entire address of the fault information. That is, the sub fault information memory has a sub fault information memory pair divided by a row and a column.

The row sub fault information memory may include column share information indicating that it corresponds to some address information stored in the column main fault information memory or corresponds to a column address of new fault information.

The column sub fault information memory may include row share information indicating that it corresponds to some address information stored in the row main fault information memory or corresponds to a row address of new fault information.

Two main fault information memories and two sub fault information memories may store only one of the row address and the column address of the fault. In two main fault information memories and two sub fault information memories, a location where the fault information is stored may be changed due to fault reconfiguration.

FIG. 6 is a flowchart illustrating an operation of storing fault information by a memory repair solution finding device according to an exemplary embodiment of the present disclosure.

In step S610, a memory repair solution finding device determines whether a memory test is finished. When a controller receives a test termination signal, it is determined that the test is finished. In step S615, the memory repair solution finding device outputs repair solution information. The controller outputs an address stored in the main fault information memory as repair solution information.

In step S620, the memory repair solution finding device detects a new fault. The controller receives a new fault signal and an address of the fault. Whenever a new fault is found, the memory repair solution finding device checks fault information stored in the main fault information memory to check whether there is a fault generated in the same line as a newly found fault.

In step S630, the memory repair solution finding device determines whether the fault must be repaired. The controller determines a must repair condition. When the fault corresponds to a line in accordance with the existing must repair fault, there is no need to additionally store, step S610 is performed.

In step S640, the memory repair solution finding device determines whether to match a main address. The controller compares whether some of an address of new fault information matches the main address of the main fault information memory. The controller compares an address of the new fault information with a main address of the row main fault information memory or the column main fault information memory.

In step S650, the memory repair solution finding device updates the main fault information memory and the sub fault information memory. When some of the address of the new fault information does not match the address stored in the main fault information memory, the memory repair solution finding device stores some of the address of the new fault information in the main fault information memory and stores the other part of the address in the sub fault information memory. That is, the fault information is also stored in an empty space of the main fault information memory.

In step S660, the memory repair solution finding device determines whether the fault information is repeated. There is no need to additionally store the same fault information so that step S610 is performed.

When the fault information is not repeated, the fault information memory not store the address in both the row direction and the column direction addresses, but stores a fault address only in one direction.

In step S670, the memory repair solution finding device determines whether it is necessary to generate must repair information. The controller determines the must repair condition whether the new fault information newly generates a must repair faulty state.

In step S680, the memory repair solution finding device sets must repair information in the main fault information memory and additionally stores the address in the sub fault information memory to update the sub fault information memory.

In step S690, the memory repair solution finding device stores unique information in the sub fault information memory and additionally stores the address to update the sub fault information memory.

Not at a clock signal timing when a new fault is detected as in step S620, as in steps of updating the fault information memory, the memory repair solution finding device reconfigures the fault information stored in the fault information memory during a clock signal interval when a new fault is not found, to ensure an empty space of the main fault information memory.

After receiving new fault information, when some of the address of the new fault information matches an address stored in the main fault information memory, the controller stores the other part of the address of the new fault information in the sub fault information memory.

After the fault information memory stores the new fault information, when there is share information in the sub fault information memory, in the overall time when fault information of the base memory is collected, at a time when the new fault information is not received, the main fault information memory and the sub fault information memory reconfigure the stored address to prepare a storable address.

After the controller receives the new fault information, when the remaining space is not sufficient in the main fault information memory, the controller or a separate buffer temporarily stores the address of the new fault information and the main fault information memory and the sub fault information memory reconfigure the stored address to prepare a storable address.

A plurality of corresponding addresses is switched so that the address having share information in the sub fault information memory does not have share information.

When the new fault information which is received by the controller does not correspond to the must repair information and the space remaining in the main fault information memory is not sufficient so that even though the main fault information memory and the sub fault information memory reconfigure the stored address, new fault information cannot be stored, the controller outputs an early termination signal. That is, when the base memory cannot be repaired, the controller outputs an early termination signal.

When the test of the base memory is finished so that new fault information cannot be received, the controller outputs the address stored in the main fault information memory as a repair solution. Finally, at a timing when the memory test is finished, the row address and the column address of the fault information stored in the main fault information memory are output as a repair solution.

Hereinafter, an operation of the memory repair solution finding device which collects the fault information and finds a repair solution in parallel will be described with reference to FIGS. 7A to 8J.

FIG. 7A is a view illustrating a basic memory which is tested by a memory repair solution finding device according to an exemplary embodiment of the present disclosure and FIG. 7B is a view illustrating a repair solution found by a memory repair solution finding device according to an exemplary embodiment of the present disclosure.

Referring to FIG. 7A, in order to describe the operation of the present embodiment, it is assumed that the base memory has eight rows and eight columns, the number of spare rows Rs which are spare resources is two and the number of spare columns Cs is two. It is assumed that locations of the faulty cells are #1(0,0), #2(0,2), #3(1,1), #4(2,5), #5(3,5), #6(4,3), #7(6, 3), #8(7, 5) and fault information is collected in this order. As illustrated in FIG. 7B, a repair solution derived by the present embodiment is an index 0-th row, an index first row, an index third column, and an index fifth column.

FIGS. 8A to 8J are views illustrating an operation of dynamically determining and storing a location of fault information in a fault information memory of a memory repair solution finding device according to an exemplary embodiment of the present disclosure.

Referring to FIG. 8A, the fault information memory stores sparse faults corresponding to #1(0,0) and #2(0,2). First fault information is stored in the row main fault information memory and the row sub fault information memory. Since the second fault information partially matches an address of the row main fault information memory, the second fault information is stored in the row sub fault information memory.

Referring to FIG. 8B, the fault information memory stores single faults corresponding to #3(1,1) and #4(2,5). Third fault information and fourth fault information do not match the address of the main fault information memory. Since a remaining space of the column main fault information memory is larger than a remaining space of the row main fault information memory, the third fault information is stored in the column main fault information memory and the column sub fault information memory. Fourth fault information is stored in the row main fault information memory and the row sub fault information memory.

Referring to FIG. 8C, the fault information memory stores a sparse fault corresponding to #5(3,5). Since a remaining space of the column main fault information memory is larger than a remaining space of the row main fault information memory, the fifth fault information is stored in the column main fault information memory and the column sub fault information memory. Since there is a sparse fault state corresponding to #4(2,5) in the row sub fault information, a flag of share information stored in the row sub fault information memory is set.

Referring to FIG. 8D, while new fault information is not received, a flag of share information is read to reconfigure the location of the fault information. #4(2,5) is stored in the column sub fault information memory and erased from the row main fault information memory and the row sub fault information memory.

Referring to FIG. 8E, the fault information memory stores a single fault corresponding to #6(4,3). Sixth fault information is stored in the row main fault information memory and the row sub fault information memory.

Referring to FIG. 8F, since the row main fault information memory and the column main fault information memory do not have a matching address and there is no empty space in the row main fault information memory and the column main fault information memory, the fault information memory stores a sparse fault corresponding to #7(6,3) in the controller or a buffer. Since there is a sparse fault state corresponding to #6(4,3) in the row sub fault information, a flag of share information stored in the row sub fault information memory is set.

Referring to FIG. 8G, while new fault information is not received, a flag of share information is read to reconfigure the location of the fault information. Locations where #6(4, 3) and #3(1,1) are stored are switched. The row and the column are switched to ensure an empty space.

Referring to FIG. 8H, the fault information memory stores a sparse fault corresponding to #7(6,3) in the column main fault information memory and the column main fault information memory.

Referring to FIG. 8I, the controller receives fault information corresponding to #8(7,5). Since information on #5(3, 5) and #4(2,5) is stored in the column sub fault information memory, #8(7,5) is determined as a must repair fault and a flag of corresponding must information in the column main fault information memory is set.

Referring to FIG. 8J, when the memory test is finished, the fault information memory outputs an address stored in the row main fault information memory and an address stored in the column main fault information memory as repair solution information.

FIG. 9 is a flowchart illustrating a memory repair solution finding method according to another exemplary embodiment of the present disclosure. A memory repair solution finding method may be performed by the memory repair solution finding device and a detailed description of the operation performed by the memory repair solution finding device and a redundant description will be omitted.

The memory repair solution finding method includes a step S204 of collecting fault information of a base memory to store the fault information in a fault information memory and a step S205 of analyzing the fault information using the fault information memory to derive a repair solution.

The memory repair solution finding method performs the step S204 of collecting fault information of a base memory to store the fault information in a fault information memory and a step S205 of analyzing the fault information to derive a repair solution in parallel.

In step S910, the memory repair solution finding method collects first fault information at a first timing by testing the base memory and then stores the first fault information in the fault information memory.

In step S920, the memory repair solution finding method reconfigures a location of an address for the first fault information stored in the fault information memory between the first timing and a second timing before storing second fault information.

In step S930, the memory repair solution finding method collects second fault information at a second timing by testing the base memory and then stores the second fault information in the fault information memory.

In the step S204 of storing the fault information, the fault information memory is dynamically analyzed to determine a location in which an address for the fault information is stored. The fault information memory includes (i) a main fault information memory which stores a part of an address of fault information of the base memory and (ii) a sub fault information memory which stores the other part of the address of the fault information of the base memory.

In the step S204 of storing fault information, a location in which a part of the address for the fault information is stored is determined in consideration of distribution of a remaining space in the main fault information memory.

In the step S205 of deriving the repair solution, when in a spare resource which replaces the fault of the base memory in the unit of line, the number of faults in one line is larger than the number of lines having a different direction, must repair information is written in the main fault information memory.

In the step S205 of deriving the repair solution, since a part of the address for the fault information of the base memory overlaps, if the fault of the base memory can be replaced with a line having a different direction in the spare resource, share information is written in the sub fault information memory.

In the step S206 of outputting as a repair solution, when the test of the base memory is finished, a part of the address stored in the fault information memory is output as a repair solution.

FIG. 10A is a view illustrating a repair rate according to various types of BIRA, FIG. 10B is a graph illustrating an analysis time according to various types of BIRA, and FIG. 10C is a graph illustrating a hardware overhead according to various types of BIRA.

As a result of comparing (10) a proposed method which is a memory repair solution finding method according to the present embodiment with other BIRA such as (1) ESP (Essential Spare Pivoting), (2) LRM (Local Repair Most max), (3) CRESTA (Comprehensive Real-time Exhaustive Search Test and Analysis), (4) ISF (Intelligent Solve First), (5) SFCC (Selected Fail Count Comparison), (6) BRANCH, (7) AMT (Address-Mapping Table), (8) LRM reusing Bitmap, and (9) FFR (Fault Free Region) in random access memory, according to the proposed method, a highest repair rate can be ensured, analysis time is almost 0, and a hardware overhead can be minimized. The memory repair solution finding method according to the present embodiment satisfies three evaluation elements including a repair rate, an analysis time, and a hardware overhead.

The hardware overhead of the memory repair solution finding method according to the present embodiment is expressed by $Rs \times (\log_2 M+2) + Cs \times (\log_2 N+2) + Rs \times Cs \times (\log_2 M + \log_2 N + 6)$. Rs is a number of spare rows, Cs is a number of spare columns, M is a number of rows of the base memory, and N is a number of columns of the base memory.

A plurality of components included in the memory repair solution finding device are combined to each other to be implemented by at least one module. The components are connected to a communication path which connects a software module or a hardware module in the apparatus to organically operate between the components. The components communicate with each other using one or more communication buses or signal lines.

The memory repair solution finding device may be implemented in a logic circuit by hardware, firm ware, software, or a combination thereof or may be implemented using a general purpose or special purpose computer. The device may be implemented using hardwired device, field programmable gate array (FPGA) or application specific integrated circuit (ASIC). Further, the device may be implemented by a system on chip (SoC) including one or more processors and a controller.

The memory repair solution finding device may be mounted in a computing device provided with a hardware element as a software, a hardware, or a combination thereof. The computing device may refer to various devices including all or some of a communication device for communicating with various devices and wired/wireless communication networks such as a communication modem, a memory which stores data for executing programs, and a microprocessor which executes programs to perform operations and commands.

In FIGS. 6 and 9, the respective processes are sequentially performed, but this is merely illustrative and those skilled in the art may apply various modifications and changes by changing the order illustrated in FIGS. 6 and 9 or performing one or more processes in parallel or adding another process without departing from the essential gist of the exemplary embodiment of the present disclosure.

The operation according to the exemplary embodiment of the present disclosure may be implemented as a program command which may be executed by various computers to be recorded in a computer readable medium. The computer readable medium indicates an arbitrary medium which participates to provide a command to a processor for execution. The computer readable medium may include solely a program command, a data file, and a data structure or a combination thereof. For example, the computer readable medium may include a magnetic medium, an optical recording medium, and a memory. The computer program may be distributed on a networked computer system so that the computer readable code may be stored and executed in a distributed manner. Functional programs, codes, and code segments for implementing the present embodiment may be easily inferred by programmers in the art to which this embodiment belongs.

The present embodiments are provided to explain the technical spirit of the present embodiment and the scope of the technical spirit of the present embodiment is not limited by these embodiments. The protection scope of the present embodiments should be interpreted based on the following appended claims and it should be appreciated that all technical spirits included within a range equivalent thereto are included in the protection scope of the present embodiments.

What is claimed is:

1. A memory repair solution finding device, comprising:
   a fault information memory which stores fault information of a base memory; and
   a controller which is connected to the fault information memory and transmits a command for reconfiguring a location where the fault information of the base memory is stored to the fault information memory,
   wherein after collecting first fault information at a first timing by testing the base memory, the fault information memory stores the first fault information, and after collecting second fault information at a second timing by testing the base memory, the fault information memory stores the second fault information, and
   wherein the location where the first fault information is stored in the fault information memory is reconfigured between the first timing and the second timing before storing the second fault information in the fault information memory.

2. The memory repair solution finding device according to claim 1, wherein the fault information memory includes (i) a main fault information memory which stores a part of an address of the fault information of the base memory and (ii) a sub fault information memory which stores the other part of the address of the fault information of the base memory and when first parts of two addresses for the fault information of the base memory are the same, the main fault information memory stores information on one of the first parts of the two addresses and the sub fault information memory stores information on second parts of the two addresses that are different.

3. The memory repair solution finding device according to claim 2, wherein a size of the main fault information memory is allocated based on a number of spare resources which replace some lines of the base memory and a size of the sub fault information memory is allocated based on the number of spare resources in accordance with a direction of a line corresponding to the spare resource in consideration of a must repair condition of the base memory.

4. The memory repair solution finding device according to claim 3, wherein the main fault information memory has (i) one part of address information for the fault information of the base memory and (ii) must repair information indicating a line to be necessarily repaired in a spare resource which replaces the fault of the base memory in the unit of lines and the sub fault information memory has (i) the other part of the address information for the fault information of the base memory and (ii) share information indicating that as some of addresses for the fault information overlap, said some of addresses are replaceable with a line having a different direction in the spare resource.

5. The memory repair solution finding device according to claim 2, wherein the main fault information memory includes (i) a row main fault information memory and (ii) a column main fault information memory, which are classified based on the spare resource which replaces the fault of the base memory in the unit of lines, and the sub fault information memory includes (i) a row sub fault information memory which stores the other part of address information which is combined with some of address information stored in the row main fault information memory to generate the entire address of the fault information and (ii) a column sub fault information memory which stores the other part of address information which is combined with some of address information stored in the column main fault information memory to generate the entire address of the fault information.

6. The memory repair solution finding device according to claim 5, wherein the row sub fault information memory includes column share information indicating that it corresponds to some of address information stored in the column main fault information memory or corresponds to a column address of new fault information and the column sub fault information memory includes row share information indicating that it corresponds to some of address information stored in the row main fault information memory or corresponds to a row address of the new fault information.

7. The memory repair solution finding device according to claim 2, wherein after receiving new fault information, when some of an address of the new fault information matches an address stored in the main fault information memory, the controller stores the other part of the address of the new fault information in the sub fault information memory and when some of the address of the new fault information does not match the address stored in the main fault information memory, the memory repair solution finding device stores some of the address of the new fault information in the main fault information memory and stores the other part of the address in the sub fault information memory.

8. The memory repair solution finding device according to claim 2, wherein after the fault information memory stores new fault information, when there is share information in the sub fault information memory, in the overall time when fault information of the base memory is collected, at a time when the new fault information is not received, the main fault information memory and the sub fault information memory reconfigure the stored address to prepare a storable address.

9. The memory repair solution finding device according to claim 2, wherein after the controller receives new fault information, when the remaining space is not sufficient in the main fault information memory, the controller or a separate buffer temporarily stores an address of the new fault information and the main fault information memory and the sub fault information memory reconfigure the stored address to prepare a storable address.

10. The memory repair solution finding device according to claim 9, wherein a plurality of corresponding addresses is switched such that an address having share information in the sub fault information memory does not have share information.

11. The memory repair solution finding device according to claim 2, wherein when new fault information which is received by the controller does not correspond to must repair information and the space remaining in the main fault information memory is not sufficient so that even though the main fault information memory and the sub fault information memory reconfigure the stored address, the new fault information cannot be stored, the controller outputs an early termination signal.

12. The memory repair solution finding device according to claim 2, wherein when a test of the base memory is finished so that new fault information cannot be received, the controller outputs the address stored in the main fault information memory as a repair solution.

13. A memory repair solution finding method, comprising:
collecting fault information of a base memory to store the fault information in a fault information memory; and
analyzing the fault information to derive a repair solution while collecting the fault information,
wherein in the storing of the fault information, after collecting first fault information at a first timing by testing the base memory, the first fault information is stored in the fault information memory, and after collecting second fault information at a second timing by testing the base memory, the second fault information is stored in the fault information memory, and
wherein in the deriving of the repair solution, a location of an address for the first fault information stored in the fault information memory is reconfigured between the first timing and the second timing before storing the second fault information in the fault information memory.

14. The memory repair solution finding method according to claim 13, wherein in the storing of the fault information, the fault information memory is dynamically analyzed to determine a location where an address for the fault information is stored, and in the deriving of the repair solution, when a test of the base memory is finished, a part of the address stored in the fault information memory is output as the repair solution.

15. The memory repair solution finding method according to claim 13, wherein the fault information memory includes (i) a main fault information memory which stores a first part of an address of the fault information of the base memory and (ii) a sub fault information memory which stores a second part of the address of the fault information of the base memory, and in the storing of the fault information, a location in which the first part of the address for the fault information is stored is determined in consideration of distribution of a remaining space in the main fault information memory.

16. The memory repair solution finding method according to claim 15, wherein in the deriving of the repair solution, when in a spare resource which replaces the fault of the base memory in the unit of lines, the number of faults in one line is larger than the number of lines having a different direction, must repair information is written in the main fault information memory.

17. The memory repair solution finding method according to claim 13, wherein in the deriving of the repair solution, when a part of the address for the fault information of the base memory overlaps, the fault of the base memory is replaced with a line having a different direction in a spare resource, and share information is written in the sub fault information memory.

* * * * *